United States Patent [19]
Roebuck et al.

[11] Patent Number: 5,468,157
[45] Date of Patent: Nov. 21, 1995

[54] NON-DESTRUCTIVE INTERCONNECT SYSTEM FOR SEMICONDUCTOR DEVICES

[75] Inventors: Randal D. Roebuck, Dallas, Tex.; Fariborz Agahdel, Los Gatos, Calif.; Salvatore P. Rizzo, Norwood, Mass.

[73] Assignee: Texas Instruments Incorporated, Dallas, Tex.

[21] Appl. No.: 146,354

[22] Filed: Oct. 29, 1993

[51] Int. Cl.$^6$ .................................................... H01R 13/15
[52] U.S. Cl. ................................ 439/264; 439/71; 439/73
[58] Field of Search ............................ 324/72.5, 158 F, 324/158 P; 439/55, 68–71, 73, 263, 264–266, 331, 525, 526

[56] References Cited

U.S. PATENT DOCUMENTS

| | | | |
|---|---|---|---|
| 4,684,184 | 8/1987 | Grabbe et al. | 439/71 X |
| 4,832,612 | 5/1989 | Grabbe et al. | 439/71 |
| 4,846,703 | 7/1989 | Matsuoka et al. | 439/71 |
| 5,127,837 | 7/1992 | Shah et al. | 439/71 |
| 5,180,976 | 1/1993 | Van Loan et al. | 439/70 X |

*Primary Examiner*—Khiem Nguyen
*Attorney, Agent, or Firm*—W. James Brady, III; Richard L. Donaldson

[57] ABSTRACT

An interconnect system (8) for providing electrical connection to bond pads on a semiconductor device (21) includes a socket (12) having a plurality of conductors (46) with retractable contact portions (14) and a carrier assembly (40) mounted on the socket (12) for carrying a semiconductor device (21). The carrier assembly (40) includes a substrate (17) having a compliant membrane (20b), a plurality of contact bumps (24) containing oxide-penetrating particles on a top surface of the compliant membrane (20b) for contacting bond pads on the semiconductor device (21), a fence (30) attached to the top surface of the compliant membrane (20b) for positioning the semiconductor device (21) so that the bond pads on the semiconductor device (21) are aligned with the contact bumps (24). Compliant membrane (20b) is part of a thin film interconnect (20). Contact bumps (24) are connected electrically with conductors (46) by conductive traces (19) and contact pads (18) formed on the thin film interconnect (20). The interconnection system (8) provides non-destructive interconnection to semiconductor device (21).

21 Claims, 7 Drawing Sheets

NON-DESTRUCTIVE INTERCONNECT SYSTEM FOR SEMICONDUCTOR DEVICES

FIELD OF THE INVENTION

This invention relates to semiconductor devices and, more particularly, to a non-destructive interconnect system for semiconductor devices.

BACKGROUND OF THE INVENTION

The semiconductor industry is entering a new phase of packaging density with the development of electronic modules containing multiple integrated circuit (IC) die. Recent increases in semiconductor device clock speeds, the number of inputs and outputs, die densities, and pad densities have made it desirable to package a variety of different integrated circuits, such as microprocessors, ASIC devices, and memory devices, together into multi-chip modules (MCM) and hybrids to create high performance products.

A factor identified by the industry as critical to the successful development of multi-chip modules is the availability of "known good die" (KGD). A known good die is a die in which there is a very high confidence level that it will operate reliably over its intended lifetime. With many die mounted into a multi-chip module, the compound effect of the individual yields of the different die becomes an issue. For example, twenty die assembled into a multi-chip module (MCM) having individual yields of 95% will produce an MCM first pass test yield of only 35%. Such a low yield will result in an undesirable quantity of material scrap and require very expensive and labor intensive rework. The use of known good die is required to achieve optimal first pass test yields in producing multi-chip modules in either a chips first or chips last assembly approach.

Since semiconductor die exhibit early life failures when tested across time, "burn-in" testing at elevated temperatures is used to identify potentially defective die and separate them from the remaining known good die. The potentially defective die are discarded and only the remaining known good die are placed in their final packaging configuration. One current test method uses mechanical probe needles at wafer level probe. A drawback to this method is that the mechanical probe needles have limited density capability and leave considerable damage in the form of impressions on the bond pad. These impressions are unacceptable in the chips "first" MCM assembly approach. Another current test method uses TAB (tape automated bonding) tape at die level test. A drawback to this method is that TAB tape in higher density configurations is costly and requires circuit area for application to a packaging scheme. In addition, the availability of TAB tape is limited at present.

Currently, the most widely used method in obtaining known good die (KGD) is packaging the die, testing the die in the package, and removing the die from the package. The extra material and processing required by this method make this form of testing very expensive. In addition, this temporary packaging method reduces integrated circuit density since it requires the die to have extra or enlarged pads for wire bonding to connect the signal leads of the package. This method of testing also has an adverse affect on die reliability due to the fact that after removing the die from the test package, the bond wires are broken off before the die is assembled into the final package configuration. Removal of the bond wires tends to damage the bond pads on the device, resulting in lower yielding bonds.

In light of present test methods, manufacturers must currently decide between assembling multi-chip modules or hybrids with pre-tested, but damaged semiconductor die or die which have not been tested or conditioned.

Accordingly, a need exists for an interconnect system that can be used to test semiconductor die or wafers without damaging them.

DETAILED DESCRIPTION OF PREFERRED EMBODIMENTS

Figure 1:
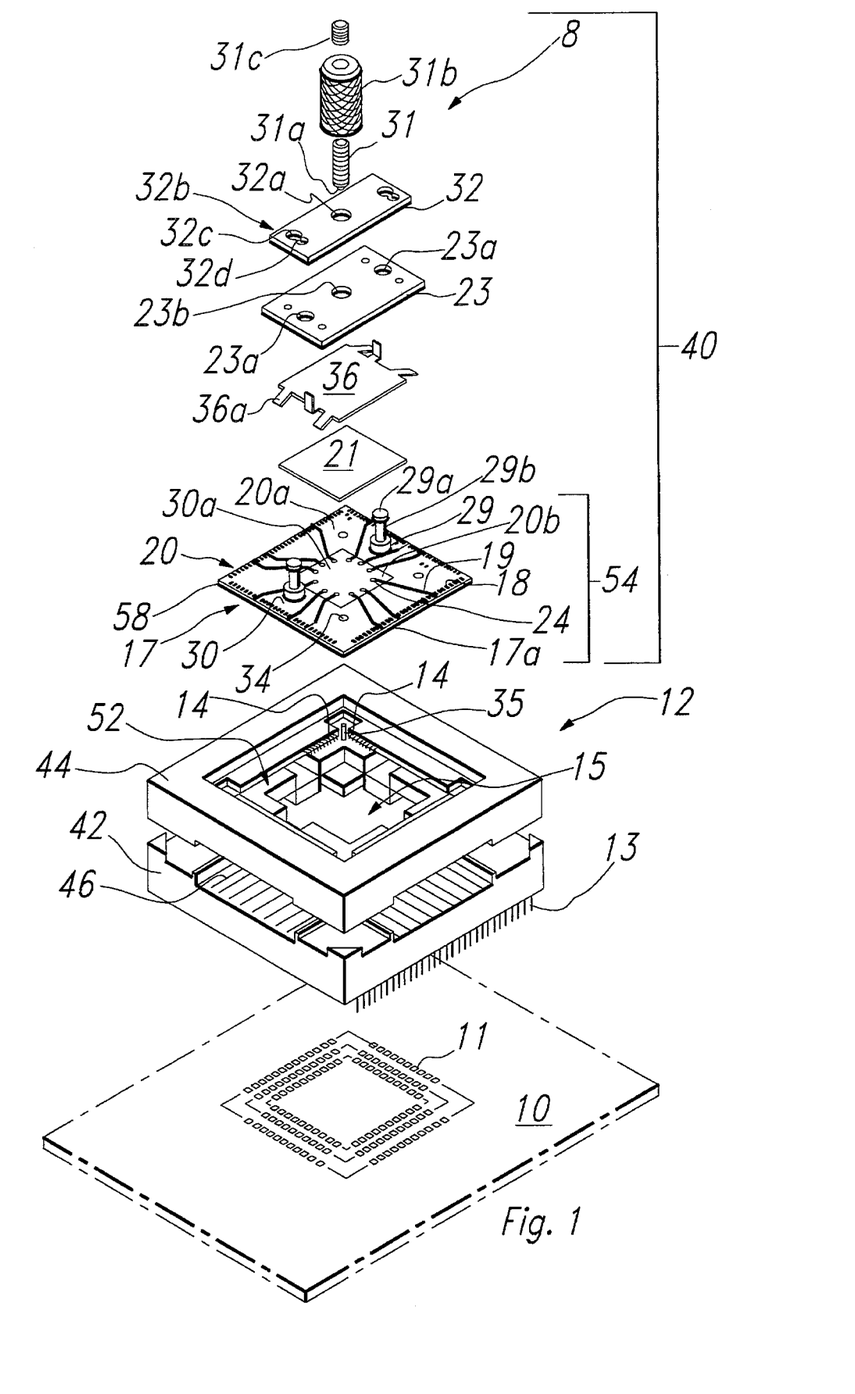
FIG. 1 is an exploded perspective view of a test interconnect system according to one embodiment of the present invention.

FIG. 1 is an exploded perspective view of a die level burn-in test interconnect system 8 according to one embodiment of the present invention. Burn-in test interconnect system 8 is used in conventional burn-in ovens and is non-destructive in that it allows semiconductor die to be thoroughly tested and conditioned without damaging the bonding pads or surface passivation of the die. Burn-in test interconnect system 8 includes a burn-in test board 10, a socket 12 for mounting on burn-in test board 10, and a die carrier assembly 40 for insertion into socket 12 that serves as temporary package for semiconductor die.

Burn-in test board 10 is connected to burn-in test equipment (not illustrated) used to test semiconductor die. Burn-in test board 10 is a printed wire board having conductive traces (not shown) that are connected to a plurality of plated through-holes 11 on burn-on test board 10 for supplying signals between a semiconductor die to be tested and the burn-in test equipment.

Socket 12 of burn-in interconnect system 8 can be mounted on burn-in test board 10 and can receive and securely hold a die carrier assembly 40 containing a die 21 to be tested. Socket 12 includes a base 42, cover 44, and a plurality of electrical conductors 46. Each conductor 46 terminates in an electrical connector pin 13 extending from the bottom of base 42 that can be inserted into a corresponding plated through-hole 11 to electrically connect socket 12 to burn-in test board 10. Socket 12 is mounted on burn-in test board 10 to test die 21 by inserting pins 13 into corresponding plated through-holes 11 in burn-in test board 10.

Each conductor 46 also includes a pad contact portion 14 for selectively contacting and holding die carrier assembly 40 in socket 12. Contact portions 14 define an opening 52 directly above base 42. The application of pressure to force cover 44 towards base 42 biases contact portions 14 of conductors 46 causing them to retract toward the edges of base 42 to increase the dimensions of opening 52. The relative dimensions of substrate 17 of die carrier assembly 40 and opening 52 are such that substrate 17 is able to pass through the opening 52 only when cover 44 is forced towards base 42 to retract pad contact portions 14.

Die carrier assembly 40 is inserted into socket 12 by forcing cover 44 towards base 42 to bias contact portions 14 to increase the size of opening 52. Die carrier assembly 40 is then placed through opening 52 and onto the top surface of base 42. When the force on cover 44 is released, contact portions 14 return to their original positions to contact pads 18 on substrate 17 and thereby securely hold die carrier assembly 40 against the top surface of base 42.

Die carrier assembly 40 includes a substrate assembly 54 on which a die 21 to be tested is placed and which distributes signals from die 21 under test to test equipment via conductors 46 in socket 12 and conductive traces in burn-in test board 10. Die carrier assembly 40 also includes a lid 23, latch 32, pressure screw 31, threaded coupling 31b, and plug screw 31c for securing die 21 to substrate assembly 54. Die carrier assembly 40 may also include an optional biasing clip 36 for providing backside ground or power bias to die 21 if die 21 requires backside ground or power bias.

Substrate assembly 54 includes a substrate 17 having a base 17a of metal, for example, with a thin film interconnect 20 formed over the top surface of base 17a. Thin film interconnect 20 may include a single layer 20a of a polymer dielectric film, such as polyimide, on which conductive signal traces 19 are formed. Alternatively, thin film interconnect 20 may include a plurality of layers 20a of a thin film polymer dielectric film with conductive signal traces 19 formed on each layer 20a. Multi-layer thin film interconnects are described in U.S. Pat. No. 5,123,850, which is incorporated hereinby reference. An opening 17b (see FIG. 5) is etched through base 17a from the bottom to produce a taut, compliant membrane 20b in a portion of thin film interconnect 20. The materials for film layers 20a and base 17a are chosen with coefficients of thermal expansion that will insure that membrane 20b remains taut or under tension in both cold and hot conditions.

Alignment holes 34 extend through base 17a and thin film interconnect 20 for receiving alignment pins 35 extending from base 42. Alignment pins 35 and holes 34 permit die carrier assembly 40 to be inserted into socket 12 in only a single orientation thus insuring that test signals supplied via test board 10 are coupled to the correct bond pads on die 21. Other mechanical or optical alignment techniques could be used instead of holes 34 and pins 35 to align die carrier assembly 40 on base 42 of socket 12.

Substrate 17 also includes a plurality of conductive pads 18 formed on the top surface of thin film interconnect 20 and electrically connected to associated signal traces 19. Pads 18 are formed around the periphery of thin film interconnect 20 so that each pad 18 contacts an associated one of the pad contact portions 14 of a conductor 46 when die carrier assembly 40 is inserted into socket 12, as hereinafter described.

Substrate 17 also includes a plurality of conductive contact bumps 24 formed on the top surface of thin film interconnect 20 and electrically connected to associated signal traces 19 for probing or contacting the bond pads of die 21. Bumps 24 contain oxide-penetrating particles to enhance the quality of the electrical connection between the bumps 24 and the bond pads of die 21 when die 21 is mounted in die carrier assembly 40. Suitable bump compositions containing oxide penetrating particles are described in U.S. Pat. No. 5,083,697, which is incorporated herein by reference. Bumps 24 are formed toward the center of thin film interconnect 20 and are surrounded by pads 18. Bumps 24 are arranged in a pattern so as to contact associated bond pads (not shown) on the bottom surface of die 21. Signal traces 19 on thin film interconnect 20 electrically connect each bump 24 to an associated pad 18.

Substrate 17 also includes a fence 30 formed on the surface of thin film interconnect 20 over signal traces 19. Fence 30 surrounds contact bumps 24 and defines a die cavity 30a in which die 21 is placed automatically using optical alignment techniques or manually for testing. Fence 30 may be formed of a polymer deposited on thin film interconnect 20 over signal traces 19. Fence 30 limits lateral movement of die 21 so as to insure that when die 21 is placed in cavity 30a for testing, the bond pads of die 21 remain in contact with bumps 24. Fence 30 also serves to protect the edges of die 21. Where die 21 is loaded manually, fence 30 also aids in mechanical alignment of die 21 on thin film interconnect 20. Substrate assembly 54 also includes posts 29 that extend upward from the top surface of thin film interconnect 20.

Lid 23, latch 32 and pressure screw 31 of die carrier assembly 40 cooperate to apply pressure to and securely hold die 21 in cavity 30a during testing. Lid 23 has holes 23a and a recessed portion 23b. Lid 23 is formed from a material that is rigid and preferably also thermally conductive, such as aluminum, so that lid 23 will act as a heat sink to dissipate heat generated by die 21 during testing. Lid 23 may be provided with fins or fingers (not shown) to more efficiently dissipate heat if necessary. After die 21 is placed in cavity 30a defined by fence 30, lid 23 is placed over and in contact with die 21 with posts 29 extending through openings 23a.

Latch 32 is formed from a rigid material, such as aluminum, and has a threaded hole 32a and locking holes 32b. Holes 32b have first and second portions 32c and 32d, respectively. Portions 32c are large enough to permit heads 29a of posts 29 to pass through. Portions 32d are not large enough to permit heads 29a of posts 29 to pass through but are large enough to accept shaft portions 29b of posts 29. Threaded hole 32a receives pressure screw 31 which has a spring biased tip 31a.

After lid 23 is placed in contact with die 21, latch 32 is placed over lid 23 with portions 32c of holes 32b aligned with posts 29 and spring biased tip 31a aligned with recessed portion 23b of lid 23. Latch 32 is then forced towards lid 23 by compressing spring biased tip 31a until heads 29a of posts 29 are above latch 32. Latch 32 is then rotated so that shafts 29b of posts 29 are received in hole portions 32d of holes 32a. Spring biased tip 31a forces the top surface of latch 32 against heads 29a of posts 29 to lock latch 32 in place. Spring biased tip 31a also forces lid 23 against die 21 to apply pressure to and securely hold die 21 in place. Threaded coupling 31b can be screwed over pressure screw 31 to contact latch 32 and threaded plug 31c screwed into coupling 31b to prevent movement of pressure screw 31.

For semiconductor die that require backside ground or power biasing, die carrier assembly 40 may also be provided with a biasing clip 36. Biasing clip 36 is formed from a conductive material, such as aluminum, and is sandwiched between lid 23 and the backside of die 21. Biasing clip 36 has conductive tabs 36a that contact those signal traces 19 on thin film interconnect 20 that supply power or ground to provide backside ground or power biasing for semiconductor die 21.

Figure 2:
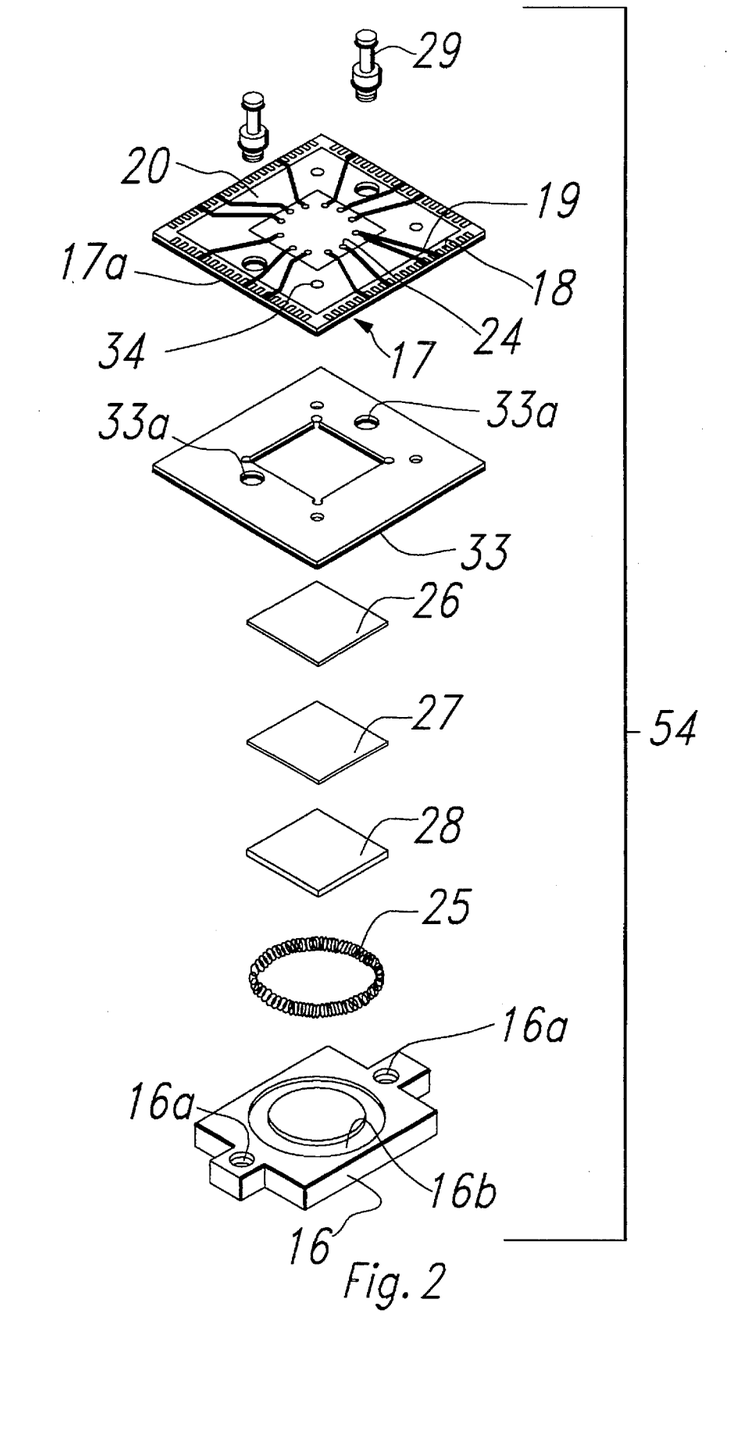
FIG. 2 is an exploded perspective view of the substrate assembly in the test interconnect system of FIG. 1.

FIG. 2 is an exploded perspective view of substrate assembly 54. As discussed above with respect to FIG. 1, substrate assembly 54 includes posts 29 and a substrate 17 having a base 17a, a thin film interconnect 20 having signal traces 19 covering the top surface of base 17a, a plurality of conductive pads 18, a plurality of conductive, oxide-penetrating contact bumps 24 and a fence 30. Substrate assembly 54 also includes a backplate 16, annular spring 25, shims 26–28, and a backplate spacer 33. Backplate spacer 33 has a thickness that insures that pads 18 are in good electrical contact with contact portions 14 when die carrier assembly 40 is inserted into socket 12.

Backplate 16 is fastened to the bottom surface of substrate 17 by passing posts 29 through holes 17b in substrate 17 and through holes 33a in backplate spacer 33 and then threading posts 29 into threaded holes 16a in backplate 16. Backplate 16 fits into the cavity 15 of socket 12 when die carrier assembly 40 is inserted into socket 12. An annular spring 25 is positioned in recess 16b of backplate 16 to supply pressure to shims 26–28 which fits into the opening 17b (see FIG. 5) in base 17a as will be described in detail below.

Figure 3:
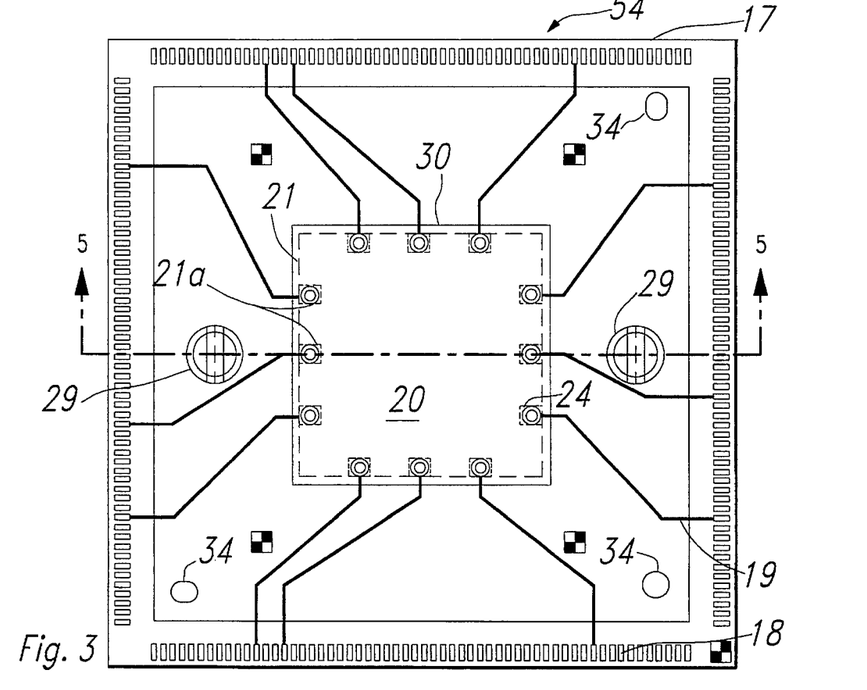
FIG. 3 is a top view of the substrate assembly in the test interconnect system of FIG. 1.
Figure 4:
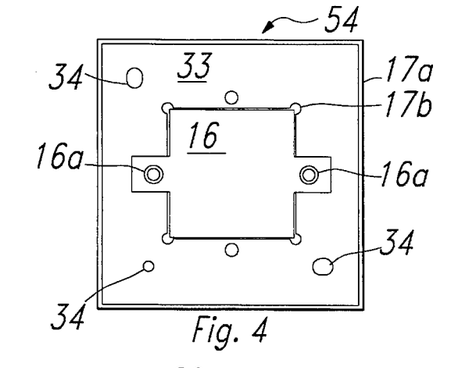
FIG. 4 is a bottom view of the substrate assembly in the test interconnect system of FIG. 1.

FIGS. 3 and 4 are top and bottom view, respectively, of substrate assembly 54. A die 21 having bond pads 21a is shown in phantom within fence 30 in FIG. 3. Although die 21 is shown with standard aluminum bond pads in a peripheral pad layout, it is understood that die 21 could have other types of bond pads, such as bumped bond pads, and that the bond pads could be arranged differently, such as in an area array.

Figure 5:
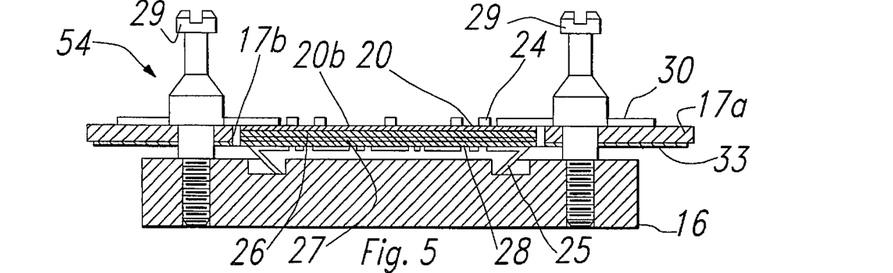
FIG. 5 is a cross-sectional view of the substrate assembly taken along section lines 5—5 of FIG. 3.

FIG. 5 is a cross-sectional view of substrate assembly 54 taken along section lines 5—5 of FIG. 3. As seen in FIG. 5, an opening 17b extends through base 17a. A portion of thin film interconnect 20 extends over opening 17b to form a compliant membrane 20b. Contact bumps 24 are located on compliant membrane 20b of thin film interconnect 20 over opening 17b. Annular spring 25 forces shims 26–28 upward into opening 17b so that shim 26 contact and supports the bottom side of the compliant membrane 20b of thin film interconnect 20 on which contact bumps 24 are formed. Annular spring 25 and shims 26–28 operate to keep contact bumps 24 in a common plane and provide accommodation for variations in height between contact bumps 24.

Figure 6:
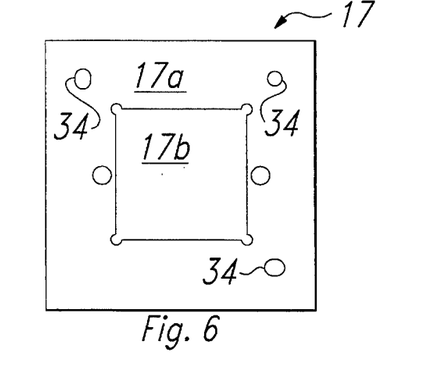
FIG. 6 is a bottom view of the substrate in the test interconnect system of FIG. 1.

FIG. 6 is a bottom view of substrate 17 showing the location of opening 17b.

Figure 7:
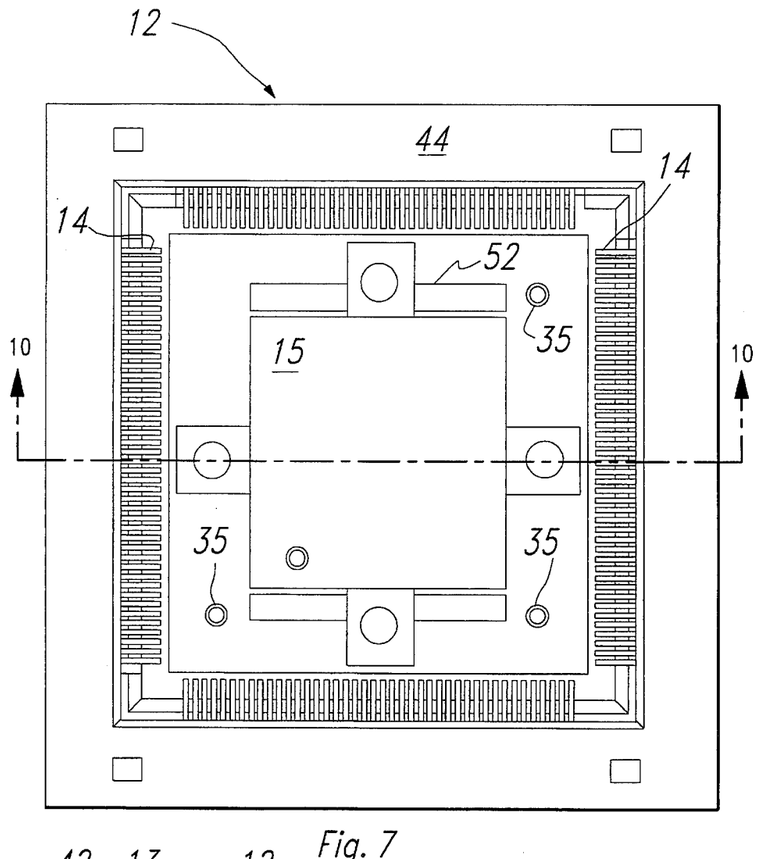
FIG. 7 is a top view of the socket in the test interconnect system of FIG. 1 in its normal non-load die carrier assembly position.
Figure 8:
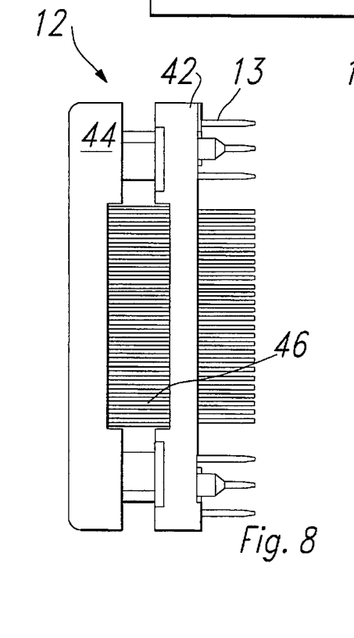
FIG. 8 is a side view of the socket of FIG. 7.
Figure 9:
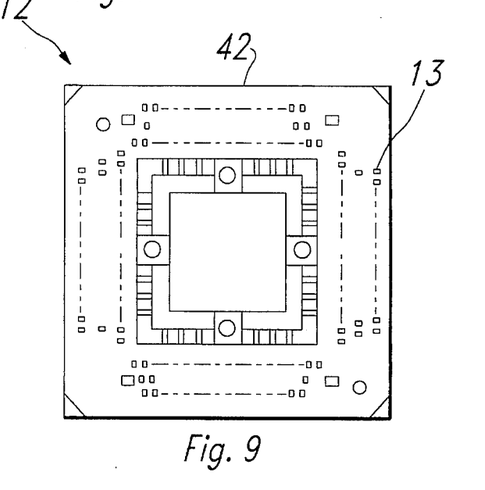
FIG. 9 is a bottom view of the socket of FIG. 7.
Figures 10, 12, 13:
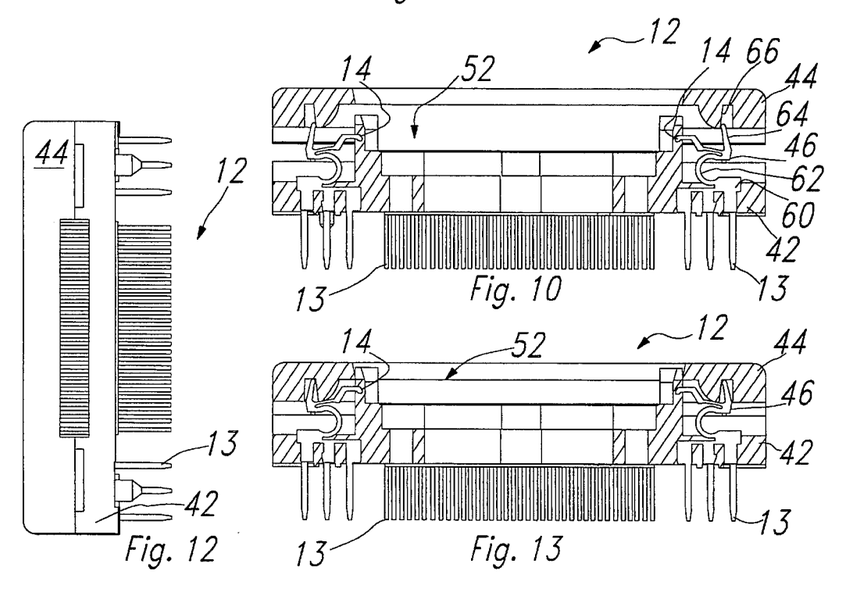
FIG. 10 is a cross-sectional view of the socket of FIG. 7 taken along section lines 10—10.
FIG. 12 is a side view of the socket of FIG. 11.
FIG. 13 is a cross-sectional view of the socket of FIG. 11 taken along section lines 13—13.

FIGS. 7, 8, and 9 are top, side, and bottom views, respectively, of socket 12 when cover 44 is not being forced toward base 42 and die carrier assembly 40 is not inserted into socket 12. FIG. 10 is a cross-sectional view of socket 12 taken along section lines 10—10 of FIG. 7. As seen in FIG. 10, each conductor 46 includes three pins 13 that are connected to body portion 60 which is rigidly mounted in base 42. Each conductor also includes a curved portion 62 which is connected to biasing portion 64 which, in turn, is connected to contact portion 14. Cover 44 includes biasing surface 66 which is angled so as to force biasing portion 64 to bend away from opening 52 when cover 44 is moved toward base 42. Since contact portion 14 is attached to biasing portion 64, when biasing portion 64 is bent by biasing surface 66, contact portion 14 is retracted by moving upwardly and outwardly thus increasing the size of opening 52.

Figure 11:
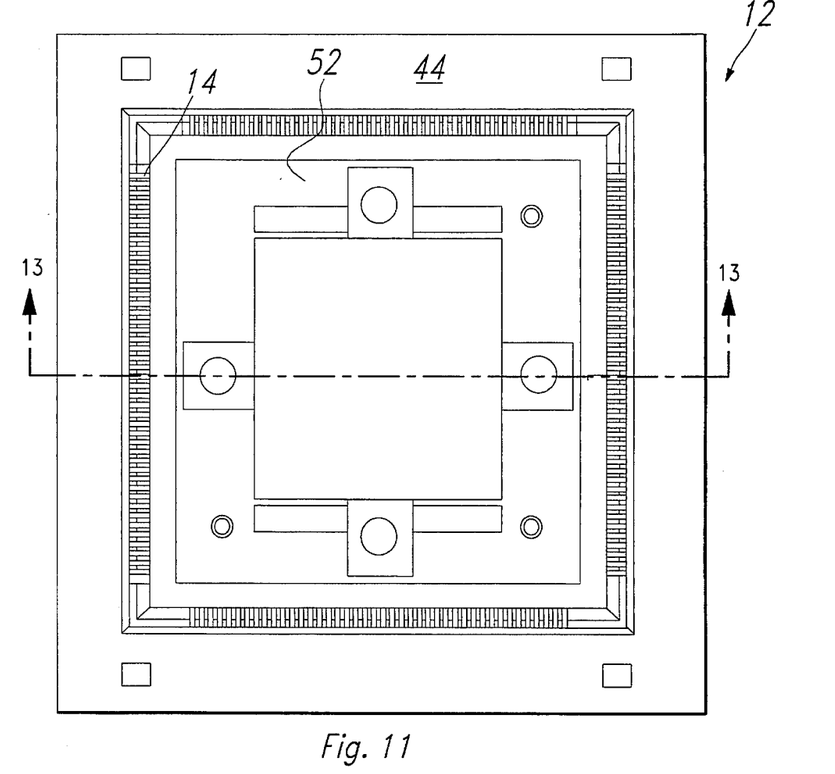
FIG. 11 is a top view of the socket in the test interconnect system of FIG. 1 in its load die carrier assembly position.

FIGS. 11 and 12 are top and side views, respectively, of socket 12 when cover 44 is being forced toward base 42 to permit die carrier assembly 40 to be inserted into socket 12. FIG. 13 is a cross-sectional view of socket 12 taken along section lines 13—13 of FIG. 11.

As can be seen by comparing FIGS. 7 and 11, opening 52, defined by contact portions 14, increases in size when cover 44 is forced toward base 42. As can be seen by comparing FIGS. 10 and 13, contact portions 14 are forced upward and outward when cover 44 is forced toward base 42 to increase the size of opening 52.

Figure 14:
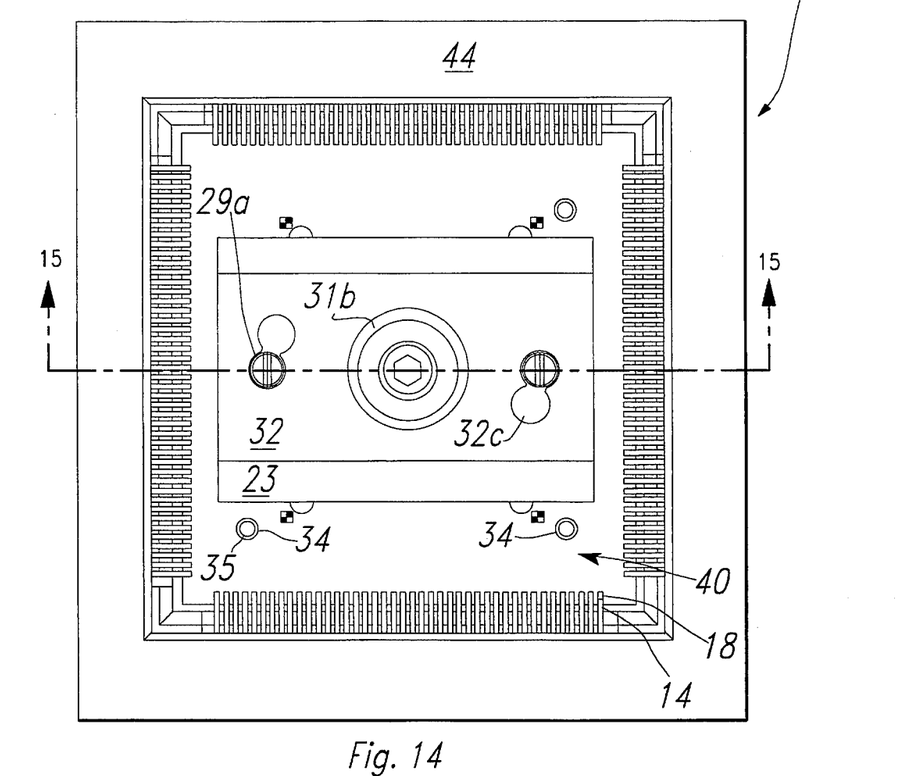
FIG. 14 is a top view of the die carrier assembly in the test interconnect system of FIG. 1.

FIG. 14 is a top view of socket 12 in which die carrier assembly 40 has been inserted. As can be seen in FIG. 14, contact portions 14 of conductors 46 extend over and are in contact with pads 18 to hold die carrier assembly 40 in socket 12 and provide electrical continuity between die carrier assembly 40 and socket 12.

Figure 15:
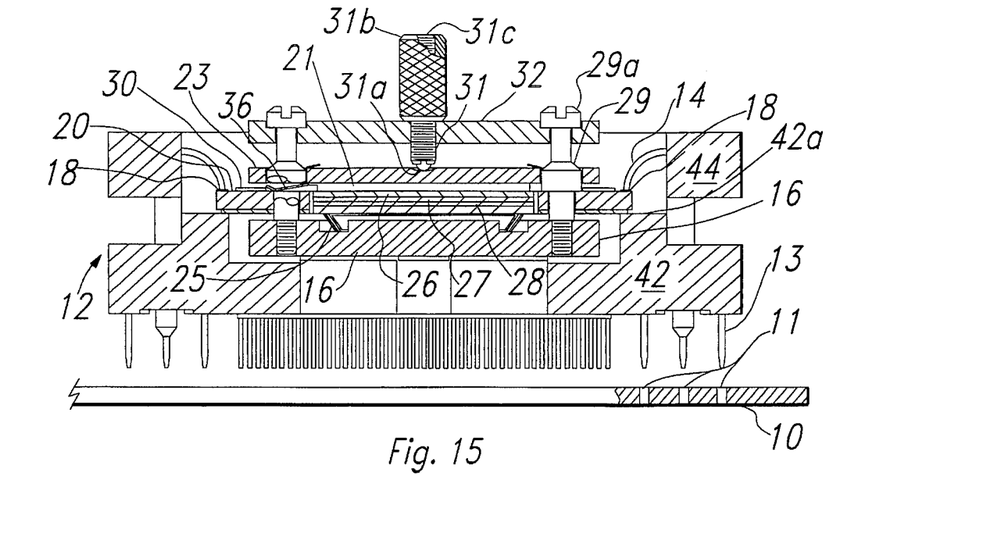
FIG. 15 is a cross-sectional view of the die carrier assembly of FIG. 14 taken along section lines 15—15.

FIG. 15 is a cross-sectional view of socket 12 and die carrier 40 taken along section lines 15—15 of FIG. 14. As seen in FIG. 15, when die carrier 40 is inserted into socket 12, contact portions 14 of conductors 46 are in contact with pads 18 on thin film interconnect 20 and securely hold substrate 17 against top surface 42a of base 42, die 21 is located in cavity 30a defined by fence 30 (see FIGS. 3 and 5). Fence 30 limits lateral movement of die 21 and properly positions die 21 on compliant membrane 20b to insure that the bond pads of die 21 are contact with contact bumps 24.

Annular spring 25 forces shims 26–28 upward into opening 17b in base 17a so that shim 26 supports the bottom side of the compliant membrane 20b of thin film interconnect 30 of which contact bumps 24 are formed. Annular spring 25 and shims 26–28 operate to keep contact bumps 24 in a common plane. Spring loaded tip 31a of pressure screw 31 forces lid 23 against the top surface of die 21 and forces latch 32 against heads 29a of posts 29 to securely hold die 21 in cavity 30a defined by fence 30.

The force supplied by spring biased tip 31a of screw 31 pressing against lid 23 and annular spring 25 pressing shims 26–28 against compliant membrane 20b securely holds contact bumps 24 against the bond pads of die 21 without damaging the bond pads. The oxide penetrating particles of contact bumps 24 and the coefficient of thermal expansion mismatch between die 21 and substrate 17 provide a nondestructive scrubbing action that penetrates the thin oxide layer that is typically found on bond pads 21a and provides good electrical contact between the contact bumps 24 and bond pads 21a on the semiconductor die 21. Following the completion of testing, die carrier assembly 40 may be opened by removing latch 32 and lid 23 and die 21 can be removed for assembly into a final packaging configuration.

Figure 16:
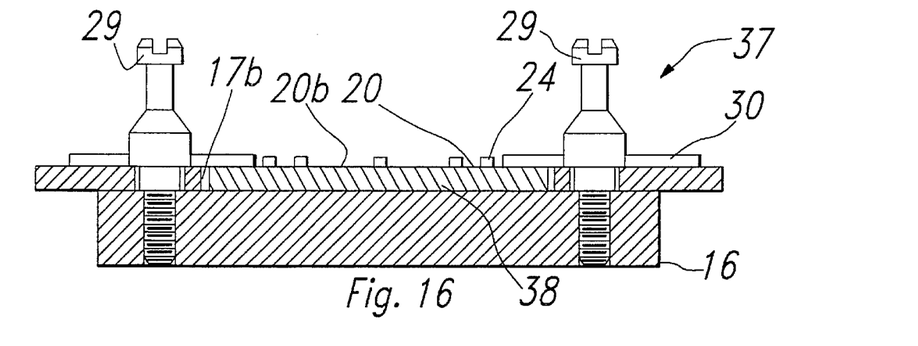
FIG. 16 is a cross-sectional view of a substrate assembly according to a second embodiment of the invention.

FIG. 16 shows a cross-section of a substrate assembly 37 according to another embodiment of the invention. Substrate assembly 37 is identical to substrate assembly 54 of FIG. 5 with the exception that annular spring 25 and shims 26–28 are replaced with an elastomer 38. Elastomer 38 fills the cavity between compliant membrane 20b and backplate 16. Elastomer 38 supports the bottom side of the compliant membrane 20b of thin film interconnect 20 on which contact bumps 24 are formed to keep contact bumps 24 in a common plane and provide accommodation for variations in height between contact bumps 24. The force supplied by spring biased tip 31a (see FIG. 1) of screw 31 pressing against lid 23 (see FIG. 1) and elastomer 38 pressing against compliant membrane 20b securely holds contact bumps 24 against the bond pads 21a (see FIG. 3) of die 21 without damaging the bond pads 21a. Substrate assembly 37 can be used in place of substrate assembly 54 in the test interconnect system 8 of FIG. 1.

Figure 17:
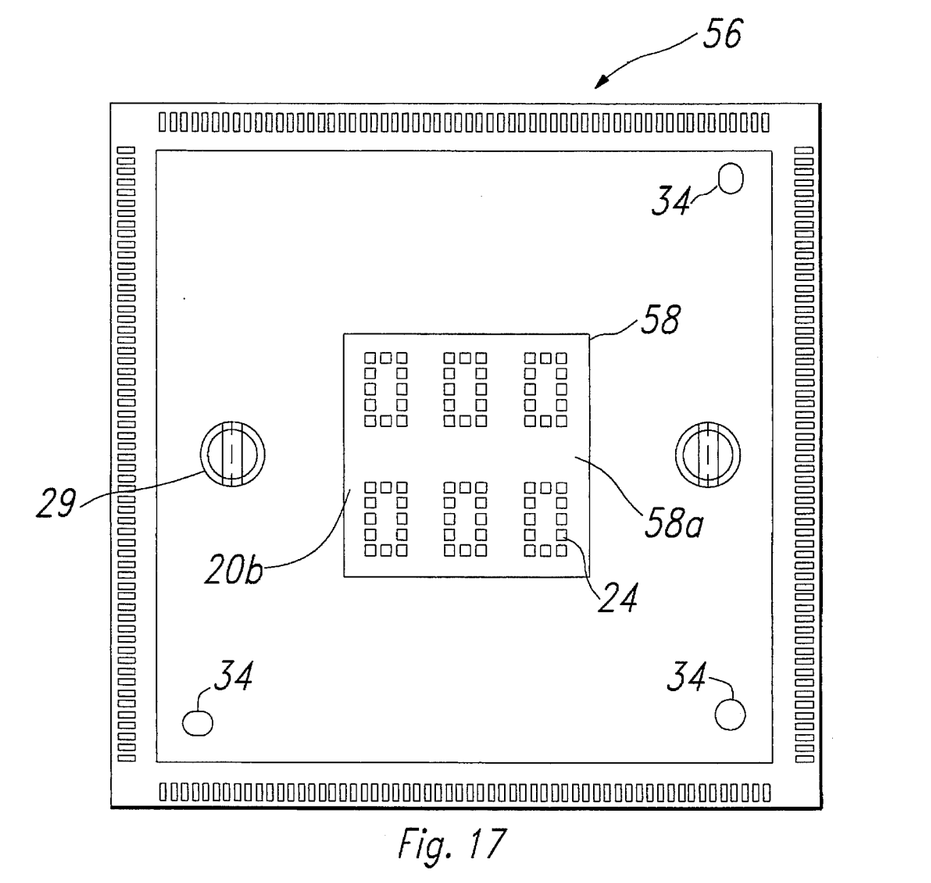
FIG. 17 is a top view of a substrate assembly according to a third embodiment of the invention.

FIG. 17 shows a top view of a substrate assembly 56 according to another embodiment of the invention. Substrate assembly 56 is similar to substrate assembly 54 of FIG. 5 but instead of supporting a single semiconductor die, substrate assembly 56 supports a wafer containing a plurality of die. Fence 58 defines a cavity 58a in which the wafer is inserted. Contact bumps 24 are arranged in groups with each group being associated with the bond pads of a single die in the wafer. Compliant membrane 20b may be supported by either an annular spring 25 and shims 26–28 as in FIG. 15 or an elastomer 38 as in FIG. 16.

A few preferred embodiments have been described in detail hereinabove. It is to be understood that the scope of the invention also comprehends embodiments different from those described, yet within the scope of the claims. For example, test interconnect system 8 may be used to perform tests other than burn-in tests and may be used to provide electrical connection to a semiconductor device to permit operation of the semiconductor device in modes other than a test mode.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An interconnect system for providing electrical connection to contact pads on a semiconductor device, comprising:
   a socket having a plurality of conductors, said conductors including retractable contact portions;
   a carrier assembly mounted on said socket for carrying a semiconductor device, said carrier assembly including a substrate having a compliant membrane, a plurality of contact bumps containing oxide-penetrating particles on a top surface of said compliant membrane for contacting bond pads on the semiconductor device, a fence attached to said top surface of said compliant membrane and defining a cavity in which the semiconductor device is inserted, said fence for positioning the semiconductor device so that the bond pads on the semiconductor device are aligned with said contact bumps, said substrate also including a plurality of conductive pads electrically connected to said contact bumps, said retractable contact portions selectively contacting said conductive pads to electrically connect the semiconductor device to said conductors.

2. The interconnect system of claim 1 in which said conductors terminate in pins for insertion into plated through-holes in a printed wire board.

3. The interconnect system of claim 1 in which said semiconductor device is a semiconductor die.

4. The interconnect system of claim 1 in which said semiconductor device is a semiconductor wafer having a plurality of semiconductor die.

5. The interconnect system of claim 1 in which said fence is formed from a polymer deposited on said top surface of said compliant membrane.

6. The interconnect system of claim 1 in which said substrate includes a base and a thin film interconnect extending over a top surface of said base, said compliant membrane being a portion of said thin film interconnect.

7. The interconnect system of claim 7 in which said base has an opening, said compliant membrane extending over said opening.

8. The interconnect system of claim 1 in which said carrier assembly includes means for contacting a bottom surface of said compliant membrane to keep said contact bumps in a common plane.

9. The interconnect system of claim 8 in which said means for contacting a bottom surface of said compliant membrane includes an elastomer.

10. The interconnect system of claim 8 in which said means for contacting includes at least one shim, said at least one shim being biased by a spring against said bottom surface of said compliant membrane.

11. The interconnect system of claim 7 in which said carrier assembly includes a backplate attached to a bottom surface of said base.

12. The interconnect system of claim 11 in which said carrier assembly includes an elastomer on said backplate for contacting a bottom surface of said compliant membrane to keep said contact bumps in a common plane.

13. The interconnect system of claim 11 in which said carrier assembly includes a spring on said backplate and at least one shim biased by said spring against a bottom surface of said compliant membrane to keep said contact bumps in a common plane.

14. The interconnect system of claim 6 in which a plurality of conductive traces are formed on said thin film interconnect, said conductive traces electrically connecting said contact bumps and said conductive pads.

15. The interconnect system of claim 1 in which said retractable contact portions have a first position to hold said carrier assembly in said socket.

16. The interconnect system of claim 15 in which said retractable contact portions have a second position to release said carrier assembly from said socket.

17. The interconnect system of claim 1 in which said carrier assembly includes means for contacting a top surface of the semiconductor device to force the contact pads of the semiconductor device against said contact bumps.

18. The interconnect system of claim 17 in which said means for contacting a top surface of the semiconductor device includes a spring biased lid.

19. The interconnect system of claim 18 in which said means for contacting includes a conductive biasing clip between the top surface of the semiconductor device and said spring biased lid for contacting a top surface of the semiconductor device to electrically bias the semiconductor device.

20. The interconnect system of claim 1 in which said carrier assembly includes a conductive biasing clip for contacting a top surface of the semiconductor device to electrically bias the semiconductor device.

21. The interconnect system of claim 6 in which said carrier assembly includes:
- a pair of posts extending from said base, each of said posts having a shaft having a first diameter and a head having a second diameter greater than said first diameter;
- a lid having a pair of openings through which said posts extend;
- a latch having a pair of openings, each of said openings in said latch having a first portion larger than a head of an associated one of said posts and a second portion smaller than a head of an associated one of said posts;
- a pressure screw extending from said latch and having a spring biased tip for contacting said lid to apply force to the top surface of the semiconductor device to force the contact pads of the semiconductor device against said contact bumps, said pressure screw forcing said latch against said heads of said posts when said shafts are aligned with said second portions of said openings in said latch.

* * * * *